(12) United States Patent
Oyu

(10) Patent No.: US 7,696,609 B2
(45) Date of Patent: Apr. 13, 2010

(54) SEMICONDUCTOR DEVICE COMPRISING A MEMORY PORTION AND A PERIPHERAL CIRCUIT PORTION

(75) Inventor: Kiyonori Oyu, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/290,509

(22) Filed: Dec. 1, 2005

(65) Prior Publication Data
US 2006/0125060 A1 Jun. 15, 2006

(30) Foreign Application Priority Data
Dec. 15, 2004 (JP) .............................. 2004-362283

(51) Int. Cl.
*H01L 23/58* (2006.01)
(52) U.S. Cl. ............... 257/622; 257/676; 257/E23.004; 438/107; 438/459
(58) Field of Classification Search ................. 257/349, 257/738, 620, 622–623, 676; 438/33, 107, 438/459
See application file for complete search history.

(56) References Cited

U.S. PATENT DOCUMENTS 6,756,562 B1 *   6/2004   Kurosawa et al. ...... 219/121.67
6,841,873 B2 *   1/2005   Yoshida et al. ............... 257/738
7,129,114 B2 *   10/2006  Akram ........................ 438/110
2001/0006233 A1 *  7/2001  Vallett ......................... 257/48
2006/0076694 A1 *  4/2006  Chen et al. ................... 257/787

FOREIGN PATENT DOCUMENTS

JP       2001-313350       11/2001

\* cited by examiner

*Primary Examiner*—Steven J Fulk
(74) *Attorney, Agent, or Firm*—McDermott Will & Emery LLP

(57) ABSTRACT

The present invention provides a semiconductor chip that provides a semiconductor device with high reliability and low leak current, and a method of manufacturing such a semiconductor chip, and more specifically, provides a semiconductor chip comprising memory portions and a peripheral circuit portion, where the memory portions and the peripheral circuit portion are formed in a main surface portion of the semiconductor chip, a thickness of the sections of the semiconductor chip passing through the main surface portion in which the memory portions are formed is larger than a thickness of sections of the semiconductor chip passing through the main surface portion in which the peripheral circuit portion is formed, and a method of manufacturing such a semiconductor chip.

5 Claims, 11 Drawing Sheets

SEMICONDUCTOR DEVICE COMPRISING A MEMORY PORTION AND A PERIPHERAL CIRCUIT PORTION

BACKGROUND OF THE INVENTION

1. Field of the Invention

The present invention relates to a semiconductor chip provided with a memory portion and peripheral circuit portion and a manufacturing method and application of such a chip.

2. Related Art

With reduction in size and weight of electronic devices in recent years, a smaller shape and thinner thickness have been required of semiconductor devices. With such changes in shape of the semiconductor devices, semiconductor chips mounted on the semiconductor devices have also been required to decrease their thickness.

As the thickness of a semiconductor chip is thinner, there is a tendency that a malfunction occurs easier in the semiconductor chip. Proposed therefore are a method of manufacturing a thin semiconductor chip with high reliability and the thin semiconductor chip manufactured by the method (JP 2001-313350).

BRIEF SUMMARY OF THE INVENTION

However, even when a semiconductor chip with high reliability is obtained at the stage of manufacturing the semiconductor chip, at the stage subsequent to manufacturing of the semiconductor chip, i.e. at the stage after manufacturing a semiconductor device actually installed with the semiconductor chip, there has been a problem that the reliability of the semiconductor device degrades such as increases in leak current of the semiconductor device and the like.

It is an object of the present invention to provide a semiconductor chip that provides a semiconductor device with high reliability and low leak current, and a method of manufacturing such a semiconductor chip.

As a result of keen examination to overcome the above-mentioned problems, the inventors of the invention found that a semiconductor device with high reliability and low leak current is given by a semiconductor chip provided with memory portions and a peripheral circuit portion where a thickness of the memory portions of the semiconductor chip is thicker than a thickness of the peripheral circuit portion, and achieved the invention.

In other words, the invention provides:

[1] a semiconductor chip comprising memory portions and a peripheral circuit portion, where the memory portions and the peripheral circuit portion are formed in a main surface portion of the semiconductor chip, a thickness of sections of the semiconductor chip passing through predetermined portions that are part of the main surface portion in which the peripheral circuit portion is formed and that are adjacent to respective memory portions is substantially equal to a thickness of sections of the semiconductor chip passing through the main surface portion in which the memory portions are formed with a normal direction to the surface of the semiconductor chip as a reference, and the thickness of the sections of the semiconductor chip passing through the main surface portion in which the memory portions are formed is larger than a thickness of sections of the semiconductor chip passing through the main surface portion in which the peripheral circuit portion is formed except the predetermined portions adjacent to the memory portions with the normal direction as a reference.

Further, the invention provides:

[2] A semiconductor chip as described in above item [1] further comprising flat portions and groove portions on the backside thereof, where the flat portions are provided at positions corresponding to a projected plan onto the backside of the memory portions and the predetermined portions with the normal direction to the surface of the semiconductor chip as a reference, the groove portions are provided at positions corresponding to the projected plan onto the backside of the peripheral circuit portion except the predetermined portions, and a depth of the groove portions to the flat portions is in a range of 5 to 60% of a length from the surface of the semiconductor chip to each of the flat portions on the backside of the semiconductor chip with the normal direction to the surface of the semiconductor chip as a reference.

Furthermore, the invention provides:

[3] a method of manufacturing a semiconductor chip as described in above item [1] or [2], comprising the steps of:
(1) forming memory portions and a peripheral circuit portion at respective predetermined positions in a main surface portion of a semiconductor wafer;
(2) grinding the backside of the semiconductor wafer;
(3) providing flat portions at positions corresponding to a projected plan onto the backside of the semiconductor wafer of predetermined portions that are part of the main surface portion in which the peripheral circuit portion is formed and that are adjacent to the main surface portion in which the memory portions are formed and of the memory portions, and further providing groove portions at positions corresponding to a projected plan onto the backside of the peripheral circuit portion except the predetermined portions; and
(4) dicing the semiconductor wafer.

Moreover, the invention provides:

[4] the method of manufacturing a semiconductor chip where the groove portions are provided by at least one step selected from a group consisting of a step of grinding the backside of the semiconductor wafer and a step of resist method.

Further, the invention provides:

[5] the method of manufacturing a semiconductor chip as described in above item [1] or [2], comprising the steps of:
(1) providing flat portions and groove portions at predetermined positions on the backside of a semiconductor wafer;
(2) providing an oxide protection film layer on the flat portions and the groove portions;
(3) bonding a semiconductor board on the oxide protection film layer;
(4) providing memory portions in a main surface portion of the semiconductor wafer at positions corresponding to a projected plan of the flat portions onto the surface of the semiconductor wafer with the normal direction to the flat portion as a reference;
(5) providing a peripheral circuit portion at a position corresponding to a projected plan of the groove portions onto the surface of the semiconductor wafer with the normal direction to the flat portion as a reference; and
(6) removing the semiconductor board bonded in step (3) and the oxide protection film provided in step (2) after steps (4) and (5).

Furthermore, the invention provides:

[6] a semiconductor device provided with the semiconductor chip as described in above item [1] or [2].

According to the invention, it is possible to provide a semiconductor chip and a method of manufacturing the semiconductor chip that provides a semiconductor device with high reliability and low leak current even in a thin device.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE INVENTION

Preferred embodiments to implement the present invention will specifically be described below in details with reference to accompanying drawings.

A semiconductor chip of the invention will be described first.

Figure 1:
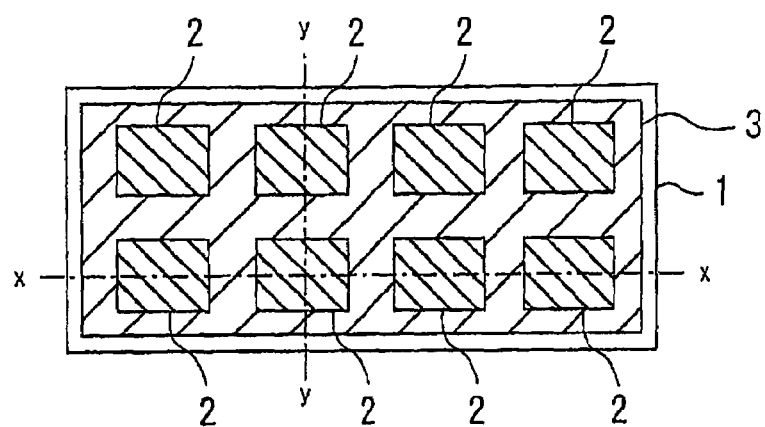
FIG. 1 is a schematic plan view of a semiconductor chip of the invention.

FIG. 1 illustrates one embodiment of the semiconductor chip of the invention.

The semiconductor chip 1 of the invention needs to have memory portions 2 and a peripheral circuit portion 3.

The semiconductor chip 1 is generally obtained from a semiconductor wafer, but types of semiconductor wafers are not limited particularly, and any wafers generally used as semiconductor wafers can be for use in the invention such as, for example, a silicon wafer, gallium arsenide wafer, gallium nitride wafer and the like.

A structure of the memory portions 2 is not limited particularly, and any forms having the storage function and storage circuit can be for use in the invention.

Further, a structure of the peripheral circuit portion 3 is not limited particularly, and any forms with functions and structures generally used conventionally can be for use in the invention.

Figure 2:
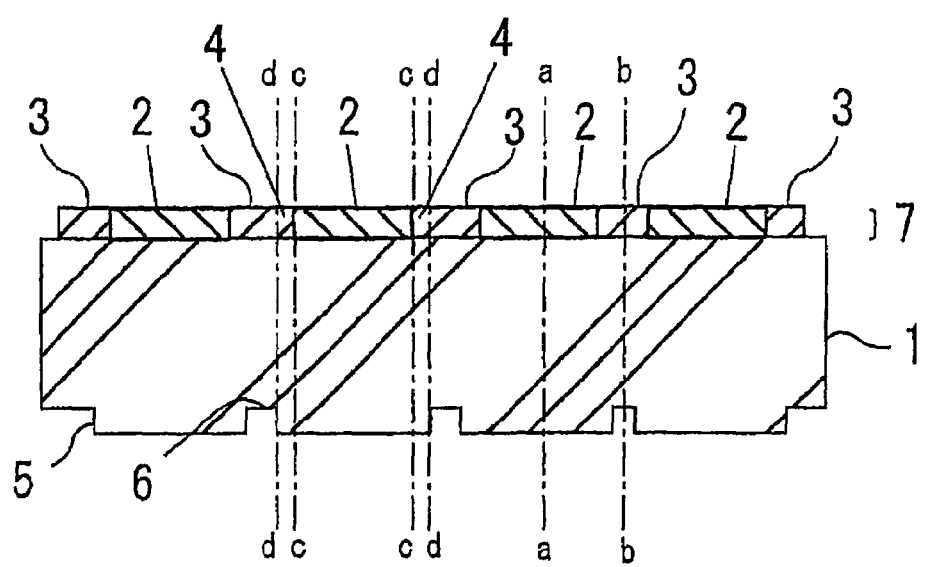
FIG. 2 is a schematic front cross-sectional view of the semiconductor chip of the invention taken along chain-dotted line x-x of FIG. 1.

FIG. 2 shows a schematic cross-sectional front view of the semiconductor chip 1 taken along chain-dotted line x-x of the semiconductor chip 1 in FIG. 1.

It is necessary that the memory portions 2 and the peripheral circuit portion 3 are formed in a main surface portion 7 of the semiconductor chip.

The main surface portion 7 represents a portion of an area from the surface to the inside of the semiconductor chip 1, as illustrated in FIG. 2, with the normal to the surface of the semiconductor chip 1 as a reference. The memory portions 2 and the peripheral circuit portion 3 are formed in the main surface portion 7.

It is necessary in the semiconductor chip 1 of the invention that a thickness of sections of the semiconductor chip corresponding to the memory portions 2 is substantially equal to a thickness of sections of the semiconductor chip corresponding to predetermined portions 4 of the peripheral circuit portion 3.

Further, as illustrated in FIG. 2, the predetermined portions 4 need to be part of the main surface portion 7 in which the peripheral circuit portion 3 is formed and be adjacent to respective memory portions 2.

Explaining in the case of FIG. 2, the predetermined portions 4 are portions adjacent to the memory portions among the peripheral circuit portion 3 formed in the main surface portion 7, and represent areas surrounded by chain-dotted lines c and d in FIG. 2.

The thickness of the sections of the semiconductor chip corresponding to the memory portions 2 indicates a thickness of a section of the semiconductor chip passing through the main surface portion in which each of the memory portions is formed, with the normal direction to the surface of the semiconductor chip as a reference. In the case of FIG. 2, a length L1 of the chain-dotted line a passing through the section of the semiconductor chip 1 corresponds to the aforementioned thickness.

Further, the thickness of the sections of the semiconductor chip 1 corresponding to the predetermined portions 4 of the peripheral circuit portion 3 indicates a thickness of a section of the semiconductor chip 1 passing through the predetermine portion 4 that is part of the main surface portion 7 in which the peripheral circuit portion 3 is formed and that is adjacent to each of the memory portions 2. In the case of FIG. 2, a length L2 of the chain-dotted line c passing through the section of the semiconductor chip corresponds to the aforementioned thickness.

It is necessary in the semiconductor chip 1 that the thickness L1 of sections of the semiconductor chip corresponding to the memory portions 2 and the thickness L2 of the chip sections corresponding to the predetermined portions 4 are larger than a thickness of sections of the semiconductor chip 1 corresponding to portions except the predetermined portions 4 of the peripheral circuit portion 3.

The thickness of sections of the semiconductor chip 1 corresponding to portions except the predetermined portions 4 of the peripheral circuit portion 3 indicates a thickness of a section of the semiconductor chip 1 passing through the main surface portion in which the peripheral circuit portion 3 is formed except the predetermined portions 4 adjacent to the memory portions 2 with the normal direction as a reference.

In the case of FIG. 2, a length L3 of the chain-dotted line b passing through the section of the semiconductor chip corresponds to the aforementioned thickness.

Figure 3:
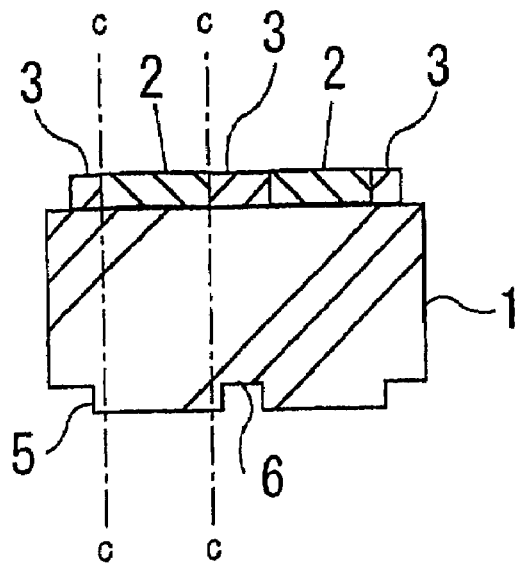
FIG. 3 is a schematic side cross-sectional view of the semiconductor chip of the invention taken along chain-dotted line y-y of FIG. 1.
Figure 4:
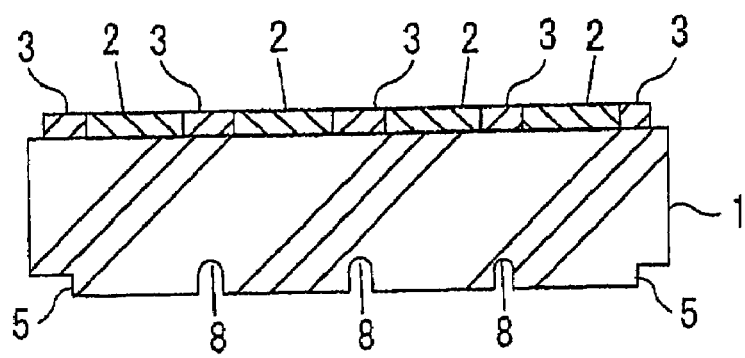
FIG. 4 is a schematic front cross-sectional view of a semiconductor chip illustrating a modification of the invention.
Figure 5:
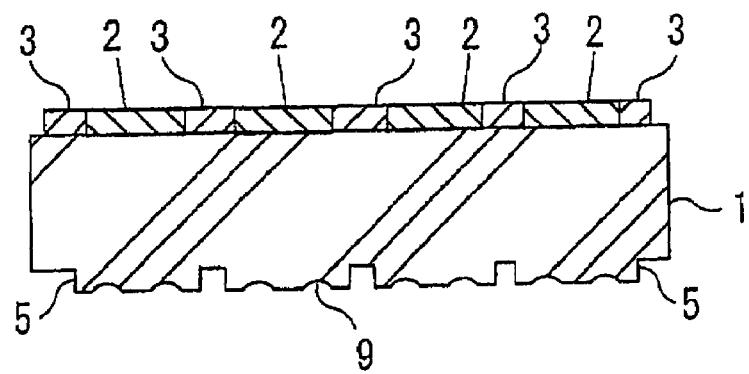
FIG. 5 is a schematic front cross-sectional view of a semiconductor chip illustrating another modification of the invention.
Figure 6:
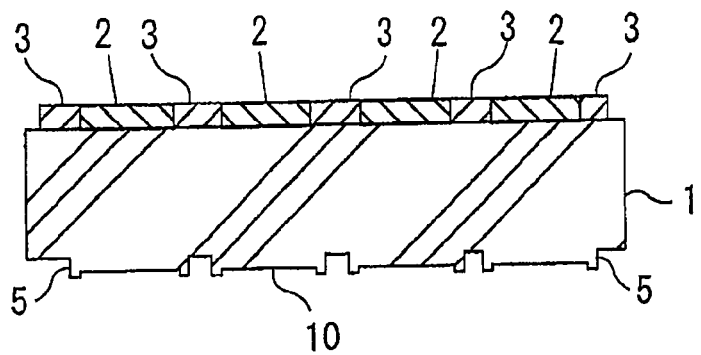
FIG. 6 is a schematic front cross-sectional view of a semiconductor chip illustrating still another modification of the invention.

In a shape of the section of the semiconductor chip of the invention, as described above, L1 and L2 are substantially equal to each other, and each larger than L3. Therefore, as embodiments of the shape of the section, for example, there are a form as illustrated in FIG. 3 where groove portions 6 are provided on the backside of the semiconductor chip, and another form as illustrated in FIG. 4 where U-shaped groove portions 8 are provided on the backside of the semiconductor chip. Further, in addition to the forms, there are modifications that dimple-shaped groove portions 9 are provided in a flat portion 5 as illustrated in FIG. 5, and that concave portions 10 are provided in the flat portion 5 as illustrated in FIG. 6, for example.

It is preferable that the semiconductor chip of the invention is provided on its backside with the flat portions 5 and groove portions 6.

As such a semiconductor chip 1, for example, there is the form as illustrated in FIG. 2 where with the normal direction to the surface of the semiconductor chip as a reference, the flat portions 5 are provided at positions corresponding to the projected plan onto the backside of the memory portions 2 and predetermined portions 4, and the groove portions 6 are provided at positions corresponding to the projected plan onto the backside of the peripheral circuit portion 3 except the predetermined portions 4.

Figure 7:
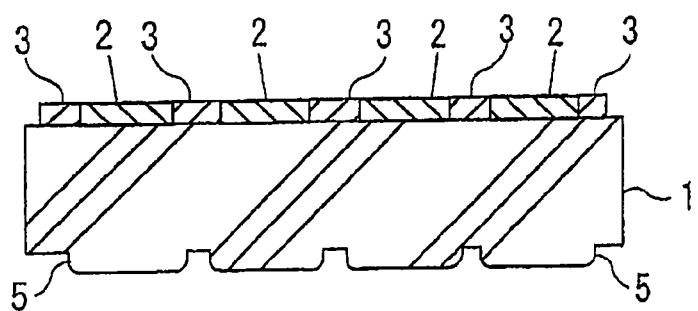
FIG. 7 is a schematic front cross-sectional view illustrating chamfering of corners of flat portions of the semiconductor chip of the invention.
Figure 8:
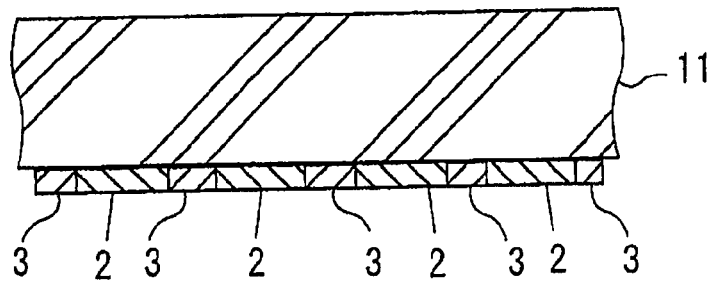
FIG. 8 is a cross-sectional view of a series of process to explain a method of manufacturing the semiconductor chip of the invention.

Further, corners of the flat portions 5 are preferably chamfered as illustrated in FIG. 7. Such a chamfered structure is formed by performing, for example, polishing processing, dry etching processing, wet etching processing and the like.

A depth L4 of the groove portion 6 to the flat portion 5 is preferably in a range of 5 to 60% of the length from the surface of the semiconductor chip to the flat portion on the backside of the semiconductor chip, and more preferably, in a range of 10 to 50%, with the normal direction to the surface of the semiconductor chip as a reference.

When the length L4 is less than 5% or exceeds 60%, the reliability deteriorates in a semiconductor device provided with the semiconductor chip of the invention.

A width L5 of the predetermined portion 4 is generally in a range of 10 to 100% of the depth L4 of the groove portion. The width L5 of 70% or more of the L3 improves the reliability of a semiconductor device provided with the semiconductor chip of the invention and is more preferable.

Herein, the width L5 of the predetermined portion 4 is the minimum distance between the chain-dotted lines c and d as illustrated in the case of FIG. 4.

Described next is a method of manufacturing the semiconductor chip of the invention.

To manufacture the semiconductor chip of the invention, for example, as shown in FIGS. 8 to 11, steps are required to form the memory portions 2 and peripheral circuit portion 3 at predetermined positions in the main surface portion of a semiconductor wafer 11.

A method of forming the memory portions 2 and peripheral circuit portion 3 is not limited particularly, and can be implemented according to generally performed methods.

Further, to manufacture the semiconductor chip of the invention, a step is required to grind the backside of the semiconductor wafer 11. Furthermore, when necessary, a polishing finish may be performed after grinding. The grinding and polishing finish steps are not limited to particularly, and can be implemented according to generally performed methods.

Next, to manufacture the semiconductor chip of the invention, a step is required to provide the flat portions and groove portions on the backside of the semiconductor wafer.

Figure 11:
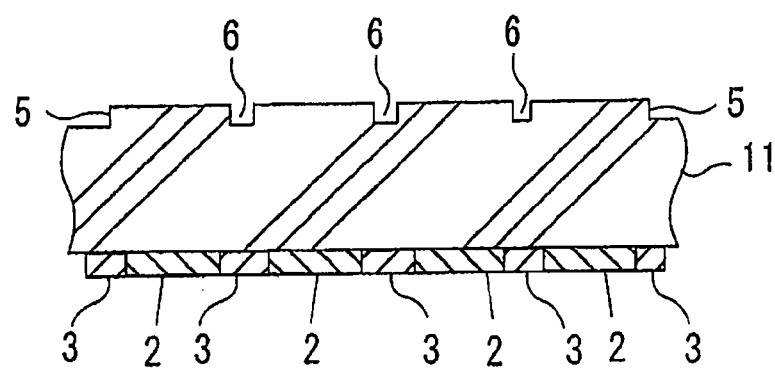
FIG. 11 is still another cross-sectional view of a series of process to explain the method of manufacturing the semiconductor chip of the invention.

For example, as illustrated in FIG. 11, the flat portions are provided at positions corresponding to the projected plan onto the backside of the semiconductor wafer of the predetermined portions that are part of the main surface portion in which the peripheral circuit portion 3 is formed and that are adjacent to respective memory portions 2 and of the memory portions 2.

The groove portions 6 are provided at positions corresponding to the projected plan onto the backside of the peripheral circuit portion 3 except the predetermined portions.

Figure 9:
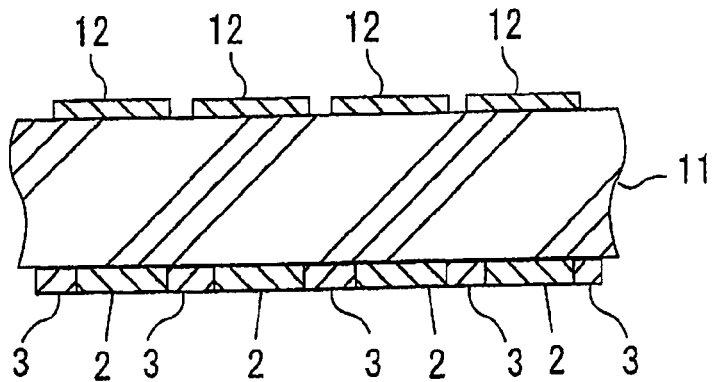
FIG. 9 is another cross-sectional view of a series of process to explain the method of manufacturing the semiconductor chip of the invention.
Figure 10:
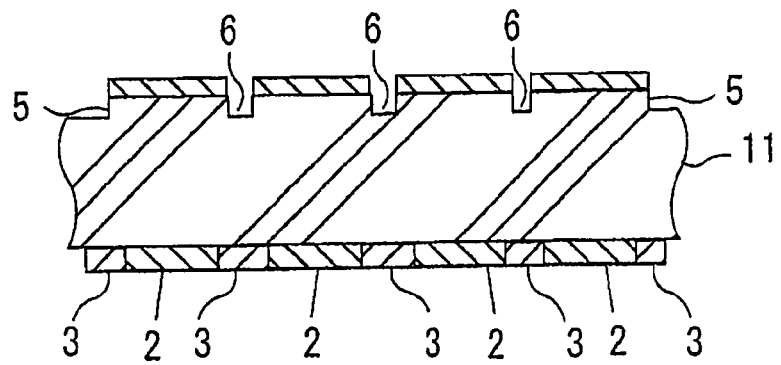
FIG. 10 is another cross-sectional view of a series of process to explain the method of manufacturing the semiconductor chip of the invention.

As an aspect of the step of providing a structure with the flat portions and the groove portions, for example, there are a method of forming resist masks 12 on the backside of the semiconductor wafer 11 to mask the predetermined portions of the backside as illustrated in FIG. 9, further forming groove portions 6 by etching processing or the like such as dry etching and wet etching as illustrated in FIG. 10, and removing the resist masks 12 as illustrated in FIG. 11, and the like.

Then, by dicing the semiconductor wafer, it is possible to obtain the semiconductor chip of the invention.

A method of dicing is not limited particularly, and can be implemented by any methods, which is the same as in following cases.

Figure 12:
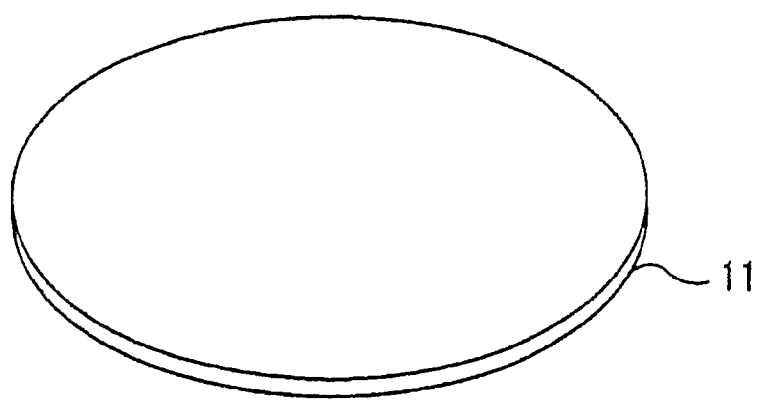
FIG. 12 is a schematic perspective view showing the backside of a semiconductor wafer prior to processing.
Figure 13:
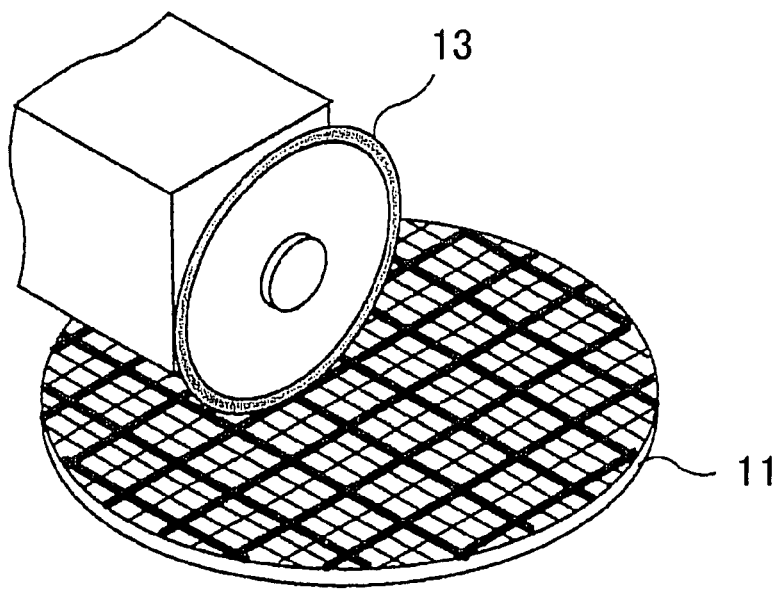
FIG. 13 is a schematic perspective view showing a step of forming groove portions on the backside of the semiconductor wafer.

As another aspect of the step of providing the structure with the flat portions and groove portions, for example, there is a specific step of providing the groove portions 6 on the backside of the semiconductor wafer 11 as illustrated in FIG. 12 using a rotating abrasive device 13 as illustrated in FIG. 13 or the like.

Figure 14:
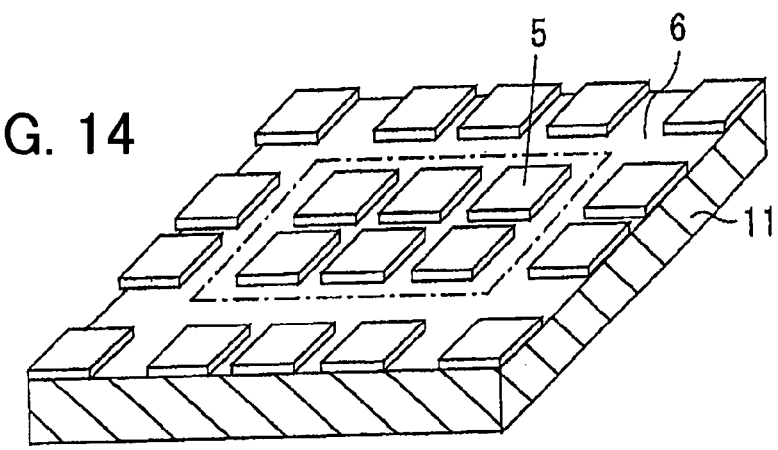
FIG. 14 is a schematic perspective view showing flat portions formed on the backside of the semiconductor wafer.

FIG. 14 is a partial enlarged view illustrating the backside of the semiconductor wafer 11 provided with the structure of the flat portions and groove portions using the rotating abrasive device 13. Grooves with different widths as illustrated in FIG. 14 can be provided by changing the thickness of a rotating blade to attach to the rotating abrasive device 13.

After providing the flat portions and groove portions using the rotating abrasive device 13, for example, by dicing a portion of the chain-dotted line of the semiconductor wafer as illustrated in FIG. 14, it is possible to obtain the semiconductor chip of the invention.

As another aspect of the step of providing the structure with the flat portions and groove portions, for example, there is a specific method of forming the flat portions and groove portions in advance inside a semiconductor wafer for assembly process. Described below is a step of forming the flat portions and groove portions in advance inside a semiconductor wafer for assembly process.

Figure 15:
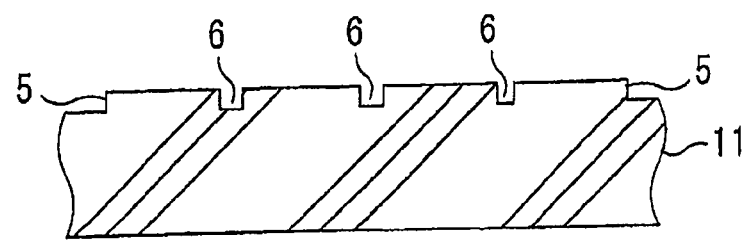
FIG. 15 is a cross-sectional view of a series of process to explain a method of manufacturing the semiconductor chip of the invention.

As an aspect of the step of providing a structure with the flat portions and groove portions, as illustrated in FIG. 15, a step is required to provide the flat portions 5 and groove portions 6 at predetermined positions on the backside of the semiconductor wafer 11. As a method of providing the flat portions 5 and groove portions 6 on the backside of the semiconductor wafer 11, for example, there are the etching method as described previously, a method using the rotating abrasive device and the like.

Figure 16:
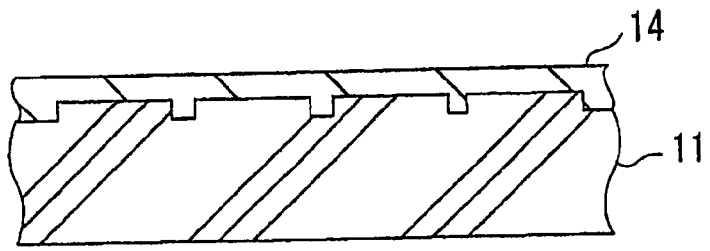
FIG. 16 is another cross-sectional view of a series of process to explain the method of manufacturing the semiconductor chip of the invention.
Figure 17:
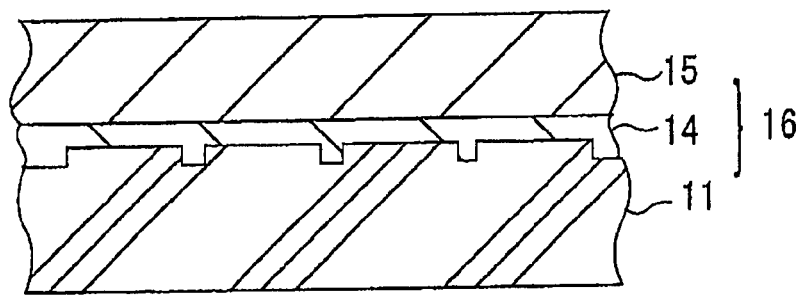
FIG. 17 is another cross-sectional view of a series of process to explain the method of manufacturing the semiconductor chip of the invention.

Next, as illustrated in FIG. 16, a step is required to provide an oxide protection film layer 14 on the flat portions 5 and groove portions 6.

A method of providing the oxide protection film layer 14 is not limited particularly, and for example, there are a method of reacting material gas constituting the semiconductor wafer, water vapor and so on at high temperature, and the like.

Next, a step is required to further bond a semiconductor board 15 on the oxide protection film layer 14.

A polishing finish may be performed on the oxide protection film layer 14 as appropriate, before the bonding step.

As the bonding step, for example, when the semiconductor wafer is comprised of silicon, by performing heat treatment of about 1,100° C., it is possible to bond the semiconductor board 15 on the oxide protection film layer 14 and obtain a semiconductor wafer 16 for assembly process. Conditions for the bonding step can be selected as appropriate corresponding to properties of materials constituting the semiconductor wafer.

Figure 18:
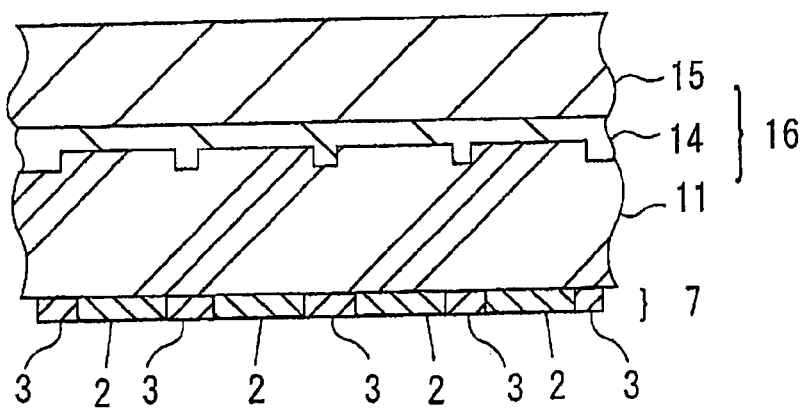
FIG. 18 is another cross-sectional view of a series of process to explain a method of manufacturing the semiconductor chip of the invention.

Then, as illustrated in FIG. 18, in the semiconductor wafer 16 for assembly process, a step is required to form the memory portions 2 and peripheral circuit portion 3 in the main surface portion 7 on the side corresponding to the surface of the semiconductor wafer 11.

The step of forming the memory portions 2 and peripheral circuit portion 3 is not limited particularly, and can be implemented according to generally performed methods.

The memory portions 2 are provided at positions corresponding to the projected plan of the flat portions 5 onto the surface of the semiconductor wafer 11, with the normal direction to the flat portions 5 as a reference.

The peripheral circuit portion 3 is provided at positions corresponding to the projected plan of the groove portions 6 onto the surface of the semiconductor wafer 11, with the normal direction as a reference.

Then, the semiconductor board 15 is removed by a grinding step or the like in the semiconductor wafer 16 for assembly process in which the memory portions and peripheral circuit portion are formed, and further, the oxide protection film layer 14 is removed with a chemical agent or the like such as hydrofluoric acid.

Figure 19:
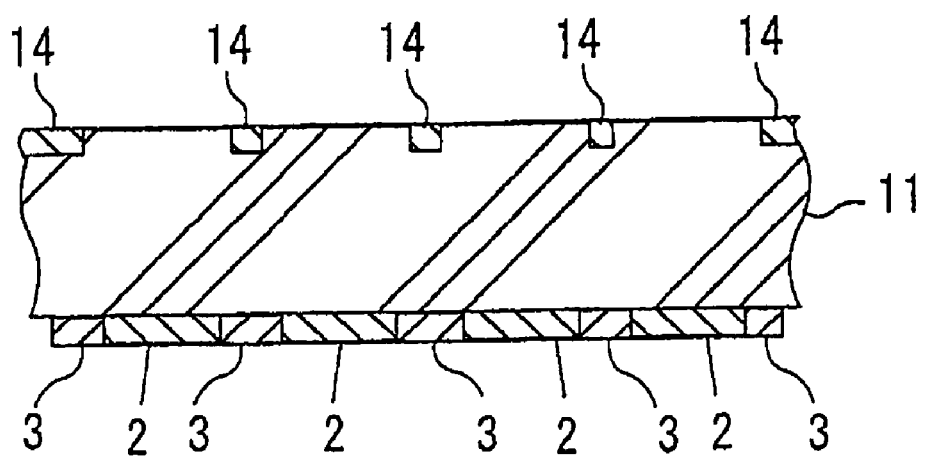
FIG. 19 is another cross-sectional view of a series of process to explain the method of manufacturing the semiconductor chip of the invention.

In addition, as illustrated in FIG. 19, the semiconductor chip of the invention contains the oxide protection film layer 14 left in the groove portions 6 formed on the backside of the semiconductor chip.

Figure 20:
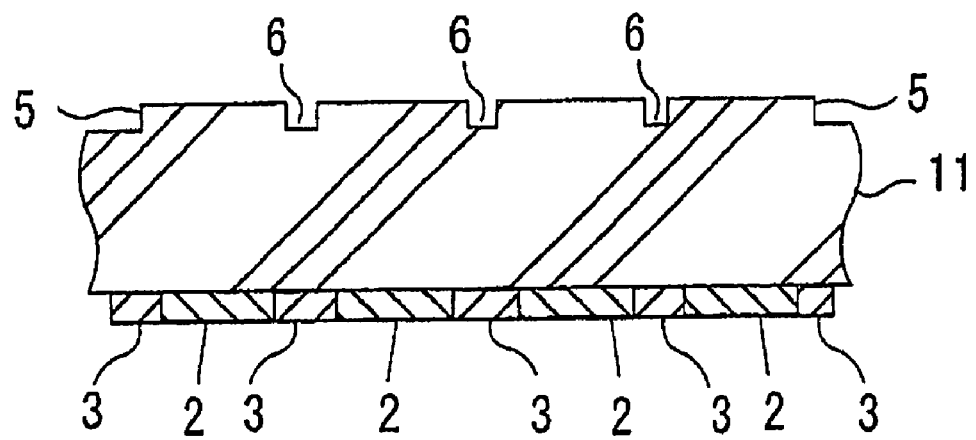
FIG. 20 is still another cross-sectional view of a series of process to explain the method of manufacturing the semiconductor chip of the invention.

Subsequently, by performing a step of dicing the semiconductor wafer 11 as illustrated in FIG. 20, it is possible to obtain the semiconductor chip of the invention.

A thickness of the semiconductor chip of the invention is generally in a range of 30 to 1,500 µm, preferably in a range of 50 to 300 µm, more preferably in a range of 60 to 150 µm, and still more preferably in a range of 70 to 120 µm.

Using the semiconductor chip, various semiconductor devices can be manufactured such as BGA, TCP, TSOP and TQFP.

Figure 21:
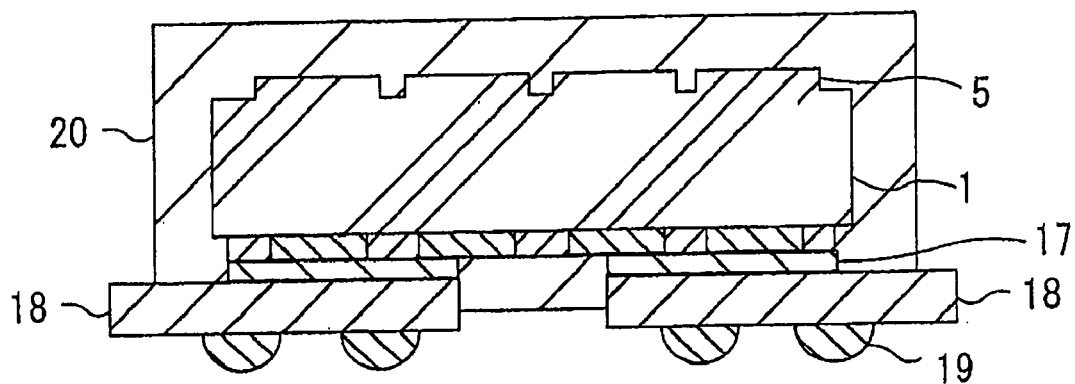
FIG. 21 is a schematic front cross-sectional view illustrating one embodiment of a semiconductor device provided with the semiconductor chip of the invention.
Figure 22:
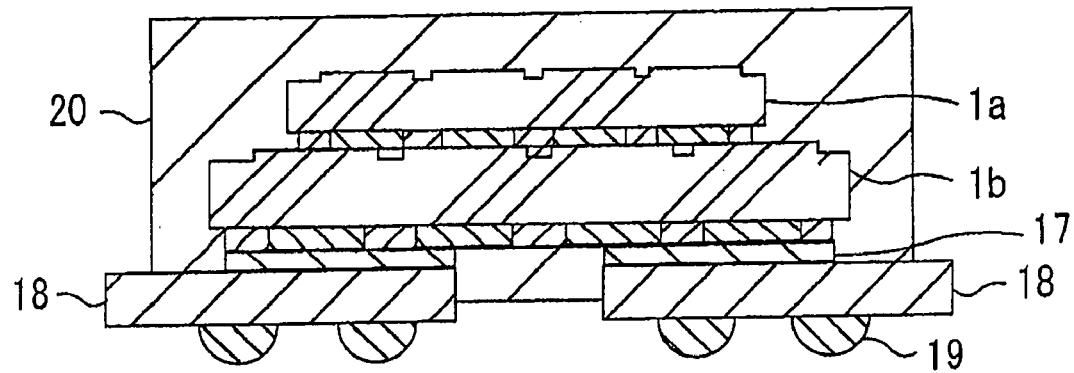
FIG. 22 is a schematic front cross-sectional view illustrating another embodiment of a semiconductor device provided with the semiconductor chip of the invention.

FIGS. 21 and 22 show schematic cross-sectional views of BGA as an example, and in addition, electric bonding such as bonding wires is not particularly shown in the figures.

As a semiconductor device obtained by using the semiconductor chip of the invention, the invention is not limited to the case where the semiconductor device includes one semiconductor chip of the invention as illustrated in FIG. 21, and there are semiconductor devices including two or more semiconductor chips of the invention as illustrated in FIG. 22, semiconductor devices of types where another semiconductor chip is laminated as well as the semiconductor chip of the invention, and the like.

[Effect]

According to the semiconductor chip of the invention, even when stress is applied to the semiconductor chip from a semiconductor device, the stress is absorbed in the peripheral circuit portion with a thin thickness of the semiconductor chip, thereby relaxing the stress to the memory portions provided in the semiconductor chip. It is thus possible to suppress occurrences of leak current caused by crystal distortion inside the semiconductor chip in the memory portions and the like, and to provide the semiconductor device with high reliability.

EXAMPLE 1

Example 1 of the invention will be described below with reference to accompanying drawings.

Figure 23:
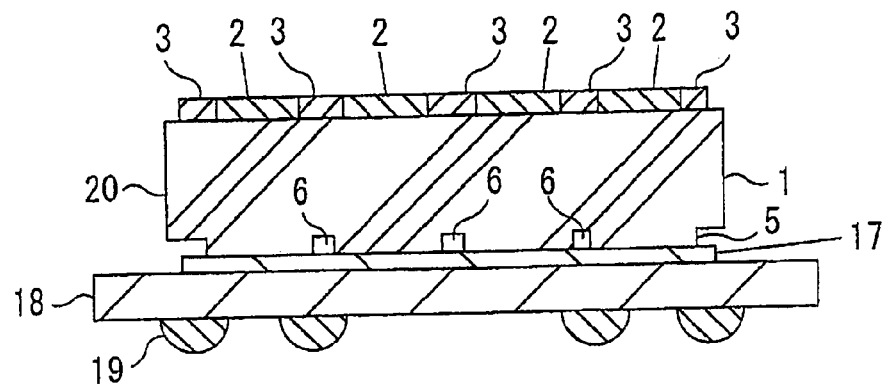
FIG. 23 is a schematic front cross-sectional view of BGA illustrating Example 1 of the invention.

FIG. 23 shows a schematic cross-sectional view of a BGA type semiconductor device provided with the semiconductor chip 1 of the invention.

The memory portions 2 and peripheral circuit portion 3 are provided in the main surface portion of the semiconductor chip 1.

Further, on the backside of the semiconductor chip 1, the flat portions 5 are provided at positions corresponding to the projected plan onto the backside of the predetermined portions of the peripheral circuit portion 3 and memory portions 2, with the normal direction to the surface of the semiconductor chip as a reference.

Furthermore, on the backside of the semiconductor chip 1, the groove portions 6 are provided at positions corresponding to the projected plant onto the backside of the peripheral circuit portion 3 except the predetermined portions, with the normal direction as a reference.

The backside of the semiconductor chip 1 is bonded to a BGA board 18 with an adhesive tape 17.

Further, solder balls 19 are provided on the BGA board 18. The semiconductor chip 1, BGA board 18, solder balls 19 and the like are provided with electric wiring with gold lines, lead frames and the like as appropriate (not shown).

Figure 26:
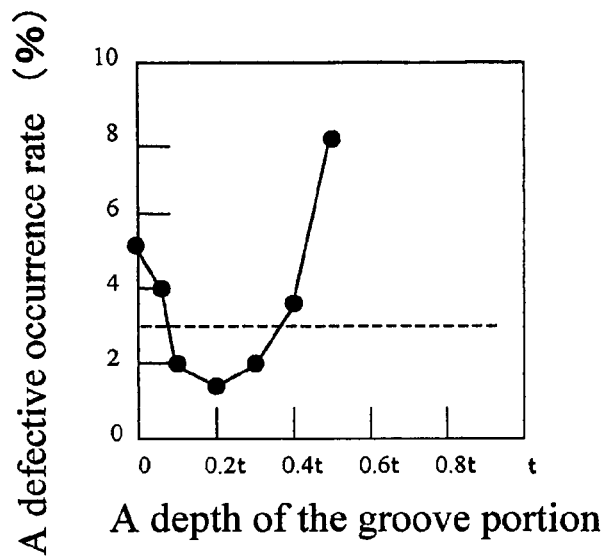
FIG. 26 is a graph illustrating a relationship between a depth of the groove portion and a defective occurrence rate in Example 1 of the invention.

FIG. 26 shows the relationship between a rate of the depth of the groove portion with a distance t as a reference from the surface of the semiconductor chip 1 to the flat portion 5 provided on the backside of the semiconductor chip and a defective occurrence rate of the leak current in the standard performance test of the obtained BGA type semiconductor device.

As described above, in the case where the semiconductor chip 1 is bonded with the adhesive tape 17, when the depth of the groove portion 6 ranges from 10 to 30% of the distance t, it is possible to obtain BGA type semiconductor devices with the defective occurrence rate less than 3%.

EXAMPLE 2

Example 2 of the invention will be described below with reference to accompanying drawings.

Figure 24:
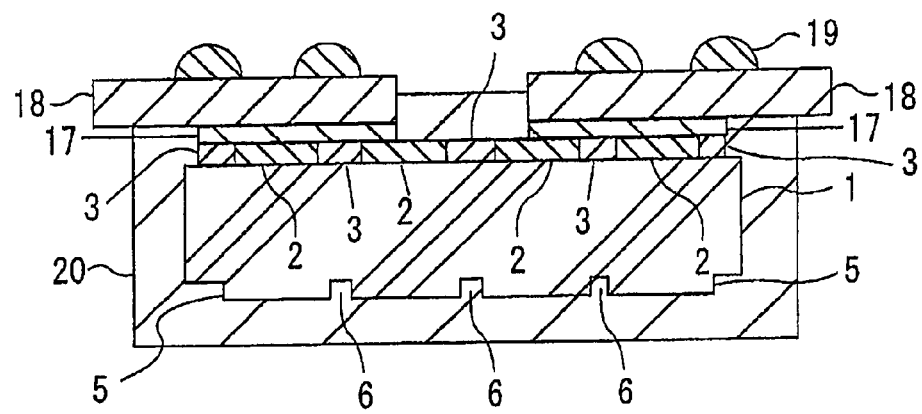
FIG. 24 is a schematic front cross-sectional view of μBGA illustrating Example 2 of the invention.

FIG. 24 shows a schematic cross-sectional view of a μBGA type semiconductor device provided with the semiconductor chip 1 of the invention.

The memory portions 2 and peripheral circuit portion 3 are provided in the main surface portion of the semiconductor chip 1.

Further, on the backside of the semiconductor chip 1, the flat portions 5 are provided at positions corresponding to the projected plan onto the backside of the predetermined portions of the peripheral circuit portion 3 and memory portions 2, with the normal direction to the surface of the semiconductor chip as a reference.

Furthermore, on the backside of the semiconductor chip 1, the groove portions 6 are provided at positions corresponding to the projected plant onto the backside of the peripheral circuit portion 3 except the predetermined portions, with the normal direction as a reference.

Part of the surface of the semiconductor chip 1 is bonded to the BGA board 18 with adhesive tapes 17, and a remaining portion of the backside of the semiconductor chip 1 is adhered with a semiconductor sealing resin 20.

Further, solder balls 19 are provided on the BGA board 18. The semiconductor chip 1, BGA board 18, solder balls 19 and the like are provided with electric wiring with gold lines, lead frames and the like as appropriate (not shown). Furthermore, the semiconductor chip 1 is surrounded and sealed by the semiconductor sealing resin 20.

Figure 27:
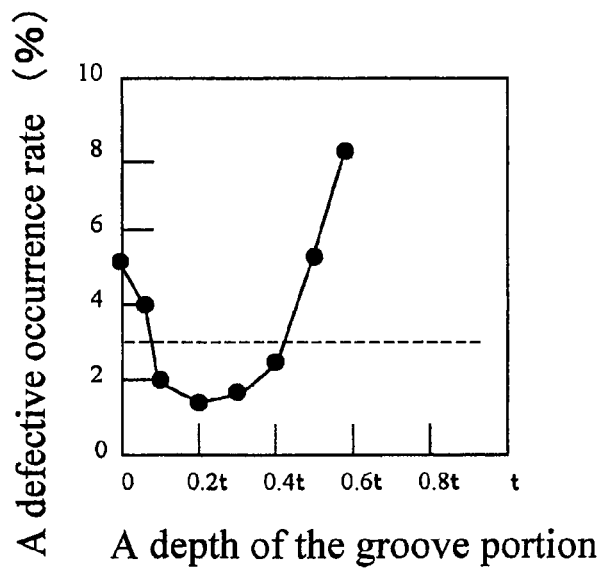
FIG. 27 is a graph illustrating the relationship between a depth of the groove portion and a defective occurrence rate in Example 2 of the invention.

FIG. 27 shows the relationship between a rate of the depth of the groove portion with a distance t as a reference from the surface of the semiconductor chip 1 to the flat portion 5 provided on the backside of the semiconductor chip and a defective occurrence rate of the leak current in the standard performance test of the obtained μBGA type semiconductor chip.

As described above, in the case where the semiconductor chip 1 is sealed, when the depth of the groove portion 6 ranges from 10 to 40% of the distance t, it is possible to obtain μBGA type semiconductor devices with the defective occurrence rate less than 3%.

EXAMPLE 3

Example 3 of the invention will be described below with reference to accompanying drawings.

Figure 25:
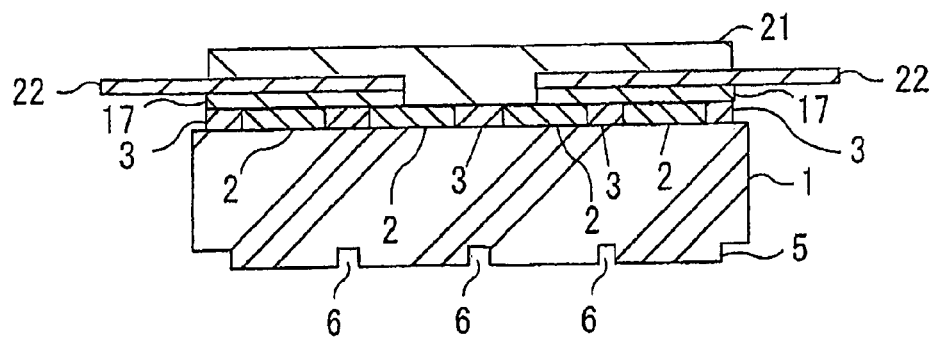
FIG. 25 is a schematic front cross-sectional view of TCP illustrating Example 3 of the invention.

FIG. 25 shows a schematic cross-sectional view of a TCP type semiconductor device provided with the semiconductor chip 1 of the invention.

The memory portions 2 and peripheral circuit portion 3 are provided in the main surface portion of the semiconductor chip 1.

Further, on the backside of the semiconductor chip 1, the flat portions 5 are provided at positions corresponding to the projected plan onto the backside of the predetermined portions of the peripheral circuit portion 3 and memory portions 2, with the normal direction to the surface of the semiconductor chip as a reference.

Furthermore, on the backside of the semiconductor chip 1, the groove portions 6 are provided at positions corresponding to the projected plant onto the backside of the peripheral circuit portion 3 except the predetermined portions, with the normal direction as a reference.

Part of the backside of the semiconductor chip 1 is bonded to lead frames 22 with adhesive tapes 17, and a remaining portion of the backside of the semiconductor chip 1 is adhered with an adhesive resin 22.

The semiconductor chip 1 is provided with electric wiring with gold lines, lead frames and the like as appropriate (not shown).

Figure 28:
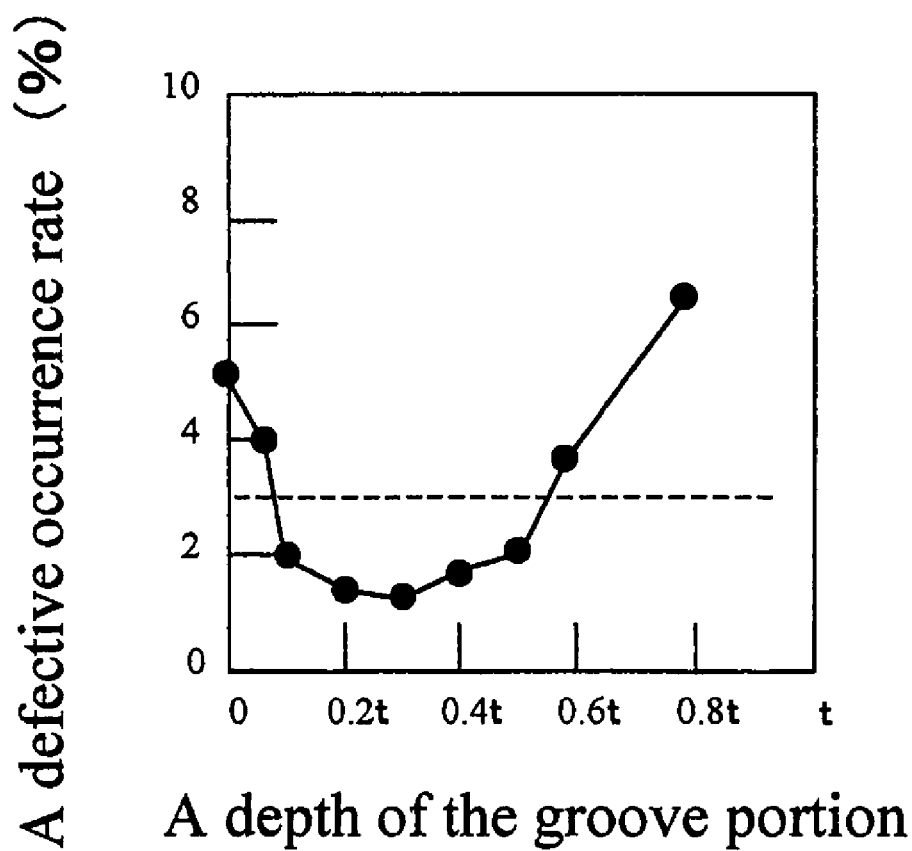
FIG. 28 is a graph illustrating the relationship between a depth of the groove portion and a defective occurrence rate in Example 3 of the invention.

FIG. 28 shows the relationship between a rate of the depth of the groove portion with a distance t as a reference from the surface of the semiconductor chip 1 to the flat portion 5 provided on the backside of the semiconductor chip and a defective occurrence rate of the leak current in the standard performance test of the obtained TCP type semiconductor chip.

As described above, in the case where the backside of the semiconductor chip 1 is not brought into contact with anything, when the depth of the groove portion 6 ranges from 10 to 50% of the distance t, it is possible to obtain TCP type semiconductor devices with the defective occurrence rate less than 3%.

The present invention is not limited to the above described embodiments, and various variations and modifications may be possible without departing from the scope of the present invention.

This application is based on the Japanese Patent application No. 2004-362283 filed on Dec. 15, 2004, entire content of which is expressly incorporated by reference herein.

What is claimed is:

1. A semiconductor device including a board and a semiconductor chip mounted on the board, wherein the semiconductor chip is formed from a semiconductor material, and comprises memory portions and a peripheral circuit portion including predetermined portions that are adjacent to respective memory portions, wherein the memory portions and the peripheral circuit portion are formed in a main surface portion of the semiconductor chip, and the semiconductor chip further comprising groove portions that are formed in the semiconductor material on a backside of the semiconductor chip only at positions corresponding to the projected plan of the peripheral circuit portion except the predetermined portions and that have a depth in which the groove portions do not reach an element of a peripheral circuit in the peripheral circuit portion, said backside opposing said main surface.

2. The semiconductor device according to claim 1, further comprising flat portions that are formed on the backside of the semiconductor chip at positions corresponding to the projected plan of the memory portions and the predetermined portions.

3. The semiconductor device according to claim 1, wherein a depth of the groove portions is in a range of 5 to 60% of the thickness of the semiconductor chip.

4. The semiconductor device according to claim 1, wherein the semiconductor chip is bonded to the board.

5. The semiconductor device according to claim 1 or 4, wherein at least one of a surface of the semiconductor chip comes into contact with a sealing resin.

* * * * *